US005639677A

United States Patent [19]
Lee et al.

[11] Patent Number: 5,639,677
[45] Date of Patent: Jun. 17, 1997

[54] METHOD OF MAKING A GAAS POWER SEMICONDUCTOR DEVICE OPERATING AT A LOW VOLTAGE

[75] Inventors: Jong-Lam Lee; Hae-Cheon Kim; Jae-Kyoung Mun; Hyung-Moo Park, all of Daejeon, Rep. of Korea

[73] Assignee: Electronics and Telecommunications Research Institute, Daejeon-Shi, Rep. of Korea

[21] Appl. No.: 665,868

[22] Filed: Jun. 19, 1996

Related U.S. Application Data

[62] Division of Ser. No. 439,891, May 12, 1995.

[30] Foreign Application Priority Data

May 16, 1994 [KR] Rep. of Korea ............... 94-10636

[51] Int. Cl.$^6$ ............................................. H01L 21/8252
[52] U.S. Cl. ...................... 437/40 LC; 437/126; 437/110
[58] Field of Search .......................... 257/20; 437/126, 437/110, 40 LC

[56] References Cited

U.S. PATENT DOCUMENTS

| | | |
|---|---|---|
| 4,473,939 | 10/1984 | Feng et al. . |
| 4,662,058 | 5/1987 | Cirillo, Jr. et al. ............... 437/40 LC |
| 4,717,685 | 1/1988 | Nakajima . |
| 4,870,478 | 9/1989 | Weitzel et al. . |
| 4,939,557 | 7/1990 | Pao et al. . |
| 4,959,326 | 9/1990 | Roman et al. . |
| 4,983,540 | 1/1991 | Yamaguchi et al. ............... 437/110 |
| 5,183,776 | 2/1993 | Lee ............................................. 437/110 |
| 5,284,782 | 2/1994 | Jeong et al. ............................. 437/126 |
| 5,343,057 | 8/1994 | Gerard et al. .............................. 257/20 |
| 5,405,797 | 4/1995 | Brugger ................................... 437/126 |

FOREIGN PATENT DOCUMENTS 1183162  7/1989  Japan .

OTHER PUBLICATIONS

Vuong et al "Sidegating in a GaAs MBE – Grown HFET..." IEEE Transactions on Electron Devices; vol. 37, No. 1; pp. 51–57; Jan. 1990.

Lee, et al.: "A GaAs Power MESFET Operating at 3.3V Drain Voltage for Digital Hand–Held Phone"; ETRI Journal vol. 16, No. 4, Jan. 1995; pp. 1–9.

(List continued on next page.)

*Primary Examiner*—Tom Thomas
*Assistant Examiner*—Toniae M. Thomas
*Attorney, Agent, or Firm*—Larson and Taylor

[57] ABSTRACT

Disclosed is a GaAs power semiconductor device operating at a low voltage and a method for fabricating the device, the method comprising the steps of sequentially forming a first undoped GaAs buffer layer, a superlattice layer, a second undoped GaAs buffer layer, a channel layer and a surface passivation layer on a semi-insulating GaAs substrate; etching a plurality of layers formed on the substrate using a device isolating mask so as to electrically isolate elements; selectively etching the surface passivation layer to form contact holes for source/drain formation and forming ohmic metallic layers in the contact holes; sequentially removing the surface passivation layer and the channel layer to some deep extent to form a contact hole for gate formation between the source and the drain; forming a gate in the contact hole and at the same time forming source and drain electrodes on the ohmic metallic layers; depositing a first SiN layer over the gate, the source and drain electrodes and the surface passivation layer; selectively etching the first SiN layer so as to expose top surfaces only of the source and drain electrodes; plating a gold layer only on the source and drain electrodes; depositing a second SiN layer over the first SiN layer and the gold layer; and forming a gold coating layer on a rear surface of the substrate. In the device, parasitic carriers in interface between the substrate and the first undoped GaAs buffer layer can be prevented from being introduced into the channel layer by the superlattice layer during operation of the device.

14 Claims, 12 Drawing Sheets

OTHER PUBLICATIONS

Lee, et al.: "2.9V Operation GaAs Power MESFET with 31.5-dBM Output Power and 64% Power–Added Efficiency"; reprinted from IEEE Electron Device Ltrs. vol. 15, No. 9, Sep. 1994.

Lee, et al.: "2.3V Operation GaAs Power MESFET with 68% Power–Added Efficiency"; GaAs IC Symposium (IEEE), PP. 133–136, 1994.

METHOD OF MAKING A GAAS POWER SEMICONDUCTOR DEVICE OPERATING AT A LOW VOLTAGE

This is a division of application Ser. No. 08/439,891 filed May 12, 1995.

BACKGROUND OF THE INVENTION

1. Field of the Invention

The present invention relates to a method of making a novel Gallium Arsenide (GaAs) power semiconductor device and, and in more particular to a method of making a GaAs power metal-semiconductor field effect transistor operating at a low drain voltage for a digital hand-held phone.

2. Description of the Prior Art

In recent years, digital hand-held phone is on a minimizing trend in its size and weight. The volume and weight of a battery account for much of the weight in such a digital hand-held phone. The supply voltage of the battery also is increased in proportion to volume and weight of the battery. Advanced high performance hand-held phones require highly efficient medium-power transistors with a low operation voltage since the total size and weight of the phone can be drastically reduced as the number of battery cells decreases. Recent advances in material preparation and device fabrication techniques have resulted in L-band GaAs power FET's operating at low drain voltages of 3.0–3.5 V with respectable output power and efficiencies, but there has been no disclosure on the linearity performance.

In order to obtain a high efficiency at low biases of 3.0–3.5 V in a power semiconductor device, both a low knee voltage and a high gate-to-drain breakdown voltage in a power amplifying device are required. The low knee voltage entails a wide range of voltage swings of the RF output signal, which attributes to high power added efficiency(PAE) with high output power. In order to use power FET's for digital hand held phones, linearity performance should be high enough to reduce third-order inter-modulation, the magnitude of which is dependent upon the DC characteristics, namely transconductance variation with gate bias. At this point, an optimization of channel structure in the MESFET is essentially needed in developing low-voltage operation power MESFET with high PAE.

In order to develop a power semiconductor device having high output power and high PAE even at a low voltage, it is necessary to meet the following conditions:
 low knee voltage
 high breakdown voltage
 high transconductance and low output conductance
 uniform transconductance in accordance with gate voltage
 low capacitance However, the above mentioned conditions are contrary to each other in accordance with a channel structure of the device and a concentration profile thereof. For example, to obtain a low knee voltage in the device, if the distance between the source and gate and the distance between the gate and drain are reduced, the breakdown voltage characteristic of the device will be badly lowered. If the doping concentration of impurity ions is quantitatively increased in the channel of the device to obtain a high transconductance thereof, the breakdown voltage will be lowered. Therefore, it is important to optimize the above conditions in accordance with characteristics needed for a power semiconductor device.

Figure 1:
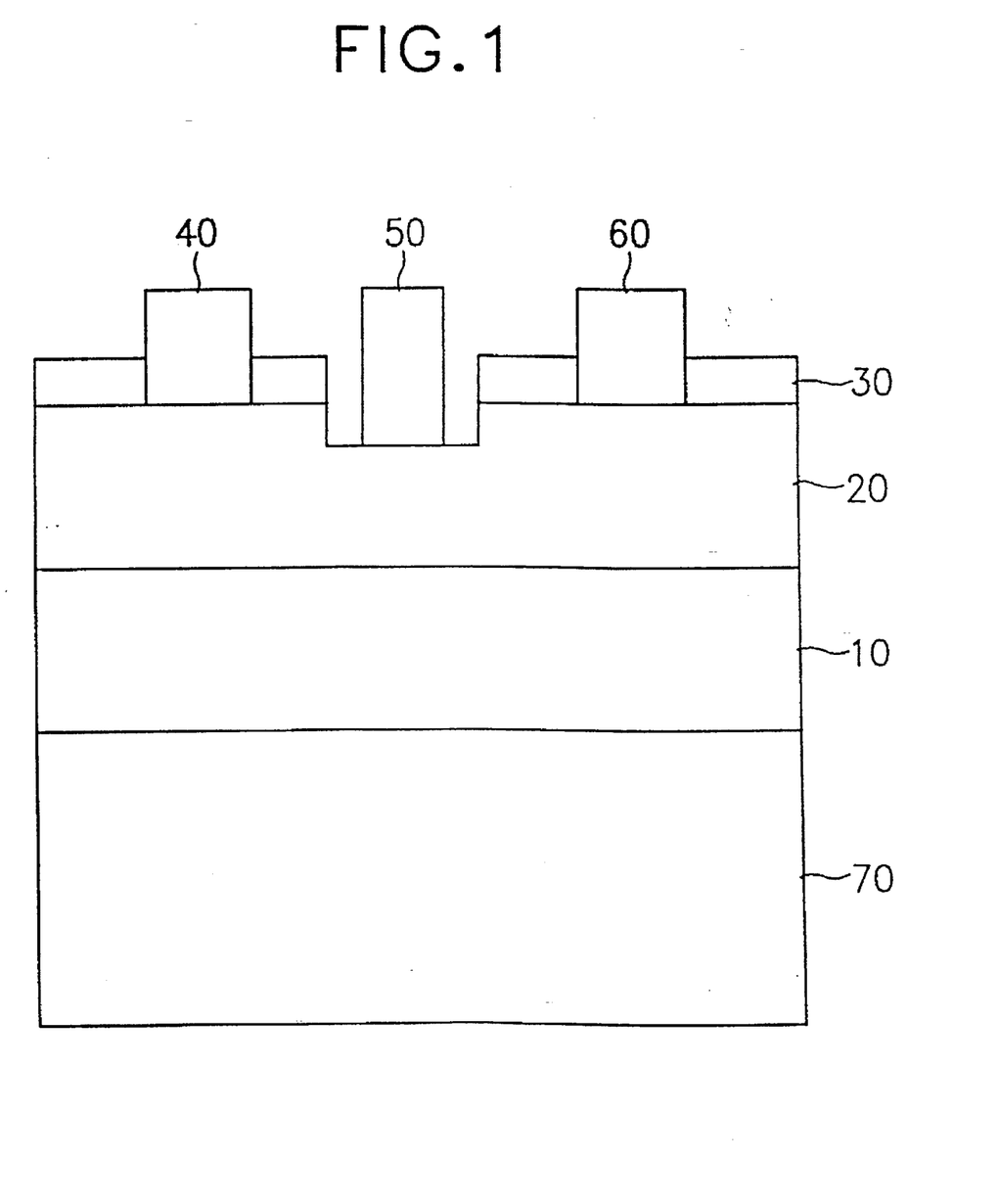
FIG. 1 is a cross-sectional view showing the construction of a conventional GaAs power semiconductor device.

Referring to FIG. 1, a conventional GaAs power semiconductor device has an undoped GaAs buffer layer 10 and a GaAs channel layer 20 which are sequentially formed on a semi-insulating GaAs substrate 70, a source electrode 40 and a drain electrode 60 which are formed on the channel layer 20 and electrically isolated by a passivation layer 30, and a gate electrode 50 which is formed in a recess portion formed by recess-etching the channel layer 20 between the source and drain electrodes. When the power semiconductor device is supplied with a source voltage, parasitic carriers are usually produced in the interface between the substrate 70 and the GaAs buffer layer 10. The parasitic carriers are introduced to the channel layer 20 through the GaAs buffer layer 10 during operation of the device. As a result, since a leakage current path is formed between the substrate and the channel layer, a leakage current and an output conductance are largely increased. As described above, in a case where a power semiconductor device has a high output conductance, it requires a relatively high source voltage for normal operation. If a power semiconductor device requires a high source voltage for normal operation, such power semiconductor devices can not be applied to a small digital hand-held phone.

Figure 2:
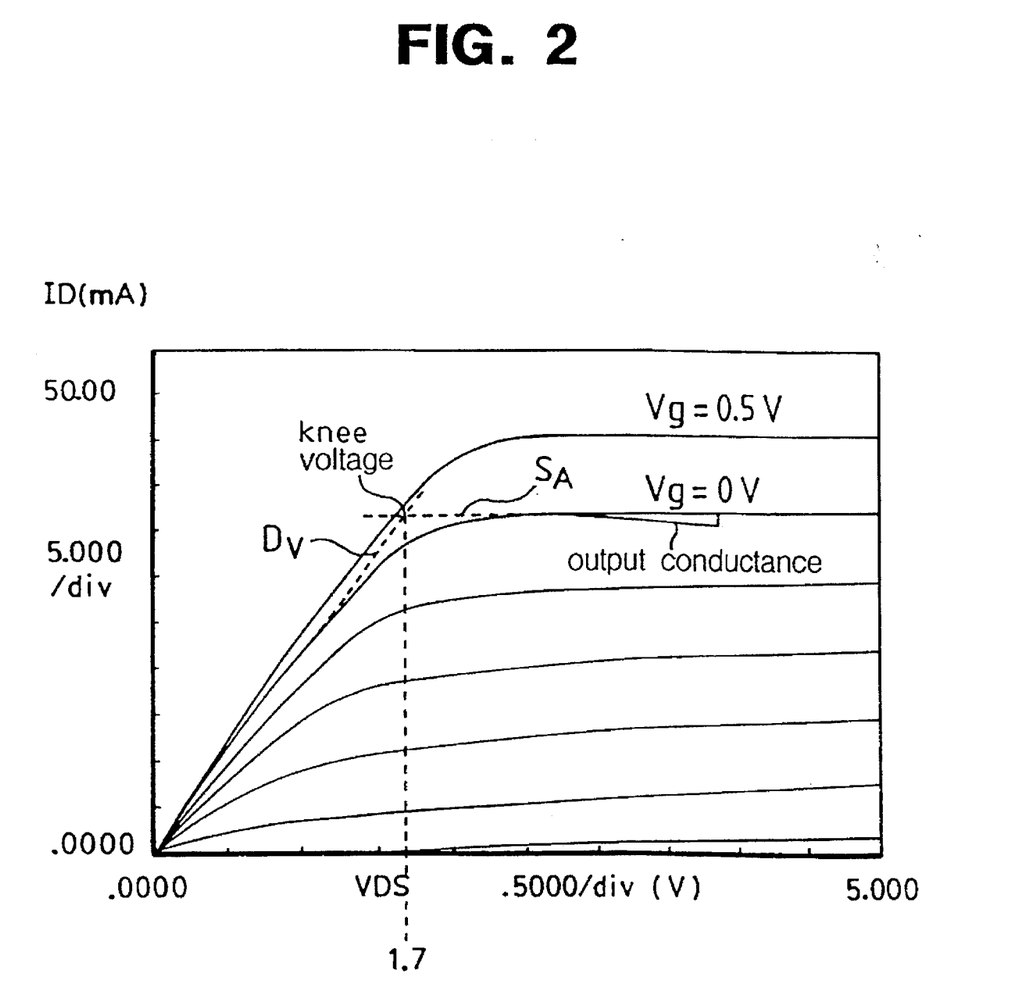
FIG. 2 is a graph showing current-voltage characteristics of the GaAs power semiconductor device of FIG. 1.

FIG. 2 is a view showing current-voltage characteristics of a power semiconductor device which has the same construction to that of FIG. 1 and which has gate length of 0.8 mm and gate width of 150 mm. In FIG. 2, a knee voltage of the device is an intersection of dotted lines $S_A$ and $D_V$ representing a saturation current and a low drain voltage, respectively, and an output conductance is a gradient of current-voltage in a saturation current region. It can be seen from FIG. 2 that the knee voltage is approximately 1.7 V and the gradient of the output conductance is diagonally sloped.

In addition, in the efforts to realize high performance hand-held phone, there has been, based on electronic device innovation and specifically on submicron technology, a surge in the development of microstructure devices that take advantage of the high speed property of electrons in GaAs. A number of transistor types have been built. The most commercially successful of these devices is the MESFET—both the depletion mode (or D-MESFET) and enhancement mode (or E-MESFET) types. Under the gate of a D-MESFET is a normally-on region depleted of electrons which allows current to pass between the source and drain of the transistor. This region is doped to be n-type. When a negative voltage is applied, the width of the depletion region increases, the channel width through which the current flows decreases and the current flow is eventually pinched off. In an E-MESFET, the region under the gate is doped so that the channel is normally pinched off. Thus, small positive gate bias voltage must be applied for current to flow between the source and drain.

To meet the demands of high speed and integration density, the MESFET needs continual improvement. Potential improvements include shortening of the gate length, reducing the series resistance between the source and gate, decreasing the parasitic capacitance, especially the gate-source and gate-drain overlap capacitances, rendering the source/drain junction depths small and providing contact metallurgy which has a low resistivity and high thermal stability and compatible with shallow junction.

In this connection, the publication by K. Ueno et al entitled "High Transconductance GaAs MESFET with Reduced Short Channel Effect Characteristics" IEDM 85, pages 82–85 (1985) describes a GaAs MESFET, wherein the gate formed by etching a $WSi_x$ film. This publication discloses reducing short channel effect by employing a highly doped channel layer grown by molecular beam epitaxy and minimizing parasitic capacitance by utilizing oxide sidewall spacers between the gate and source/drain. Ueno et al uses a hot gate process in which the gate is formed first, followed by the formation of the source/drain. The basic disadvantage of the hot gate process is that the gate metal has a high resistivity which is not desirable for interconnection purposes. Also, the hot gate process does not permit threshold voltage trimming late in the device fabrication. After forming the gate by ion-milling planarization process, source/drain ohmic contacts are formed by AuGe/Ni deposition and sintering. The basic shortcoming of this disclosure is that it is unsuitably for forming submicron sized MESFET owing to significant (as much as 0.5 micron) lateral migration at high temperature of the gold in the AuGe/Ni metallurgy used for source/drain contacts causing electrical shorting. Also, the vertical transport of the gold precludes use of this process for forming shallow junction devices. Importantly, this process is limited to fabrication of a MESFET having a gate width dictated by resolution limit of lithography.

In order to overcome these problems, it has been proposed that a conventional MESFET structure be is provided with a gate which is of submicron length, symmetrical, planar and self-aligned to the source/drain via submicron-wide insulator spacers. Importantly, the gate does not overlap the source/drain, thereby eliminating the gate to source/drain overlap capacitance and increasing the device speed. The provision of the sidewall spacers minimizes device punchthrough and short channel effects and permits good control of the device channel length and threshold voltage. Since the source/drain are placed extremely close to the gate, the source-gate series resistance is minimized, contributing to the device speed.

However, even in the above described MESFET structure, since parasitic carriers occurring in the semi-insulating GaAs substrate are introduced into the channel layer during operation of the device, a leakage current path is formed between the substrate and the channel layer. As a result, a leakage current and an output conductance are largely increased and thus the MESFET requires a relatively high source voltage for normal operation thereof.

SUMMARY OF THE INVENTION

It is an object of the present invention to provide a method of fabricating a GaAs power semiconductor device in which a high power added efficiency can be produced at a low supply voltage.

It is a further object of the present invention to provide a method of fabricating a GaAs power semiconductor device which includes a superlattice layer between first and second GaAs buffer layers formed on a semi-insulating GaAs substrate so that parasitic carriers occurring in an interface between the substrate and the first buffer layer can be prevented from being introduced into an active region through the buffer layers.

It is another object of the present invention to provide a method of fabricating a GaAs power semiconductor device which includes a superlattice layer between a GaAs buffer layer formed on a semi-insulating GaAs substrate and a GaAs channel layer so that parasitic carriers occurring in an interface between the substrate and the buffer layer can be prevented from being introduced into the channel layer through the buffer layer.

It is an additional object of the present invention to provide a method of fabricating a GaAs power semiconductor device in which a high-low doped channel structure is used as an active channel layer so as to improve the output power gain thereof.

It is another object of the present invention to provide a method of fabricating a GaAs power semiconductor device in which an undoped GaAs layer on an active channel layer is used as a surface passivation layer so as to prevent surface defects in the active channel layer created by oxygen chemisorption.

According to one aspect of the method of the present invention, a GaAs power semiconductor device is produced which operates at a low voltage comprises a semi-insulating GaAs substrate; a first undoped GaAs buffer layer formed on the substrate; a superlattice layer formed on the first undoped GaAs buffer layer; a second undoped GaAs buffer layer formed on the superlattice layer; a channel layer formed on the second undoped GaAs buffer layer; contact hole formed by selectively etching the channel layer to some deep extent; a gate formed in the contact hole; source/drain formed on the channel layer; a passivation layer formed over the gate and the source/drain; and a gold coating layer formed on a rear surface of the substrate.

In the semiconductor device, the channel layer comprises a high-doped GaAs layer formed on the first undoped GaAs buffer layer and a low-doped GaAs layer formed on the high-doped GaAs layer.

In the semiconductor device, the superlattice layer is formed of several tens of $Al_xGa_{1-x}As/GaAs$ films, each of the $Al_xGa_{1-x}As/GaAs$ films being approximately 50 Å in thickness.

In the semiconductor device, a fist distance between the gate and the source is set relatively longer than a second distance between the gate and the drain, the first distance is approximately 0.5 μm and the second distance is approximately in the 0.8 to 1.5 μm range.

In the semiconductor device, each of the source and drain is formed of AuGe/Ni ohmic electrode.

According to the semiconductor device, parasitic carriers occurring in interface between the substrate and the first undoped GaAs buffer layer are prevented from being introduced into the channel layer by the superlattice layer during operation of the device.

According to a further aspect of the present invention, the method for fabricating a GaAs power semiconductor device operating at a low voltage comprises the steps of forming a first undoped GaAs buffer layer on a semi-insulating GaAs substrate; growing a superlattice layer on the first undoped GaAs buffer layer; forming a second undoped GaAs buffer layer on the superlattice layer; forming a channel layer on the second undoped GaAs buffer layer; depositing a surface passivation layer on the channel layer; etching a plurality of layers formed on the substrate using a device isolating mask so as to electrically isolate elements; selectively etching the surface passivation layer to form contact holes for source/drain formation and forming ohmic metallic layers in the contact holes; sequentially removing the surface passivation layer and the channel layer to some deep extent to form a contact hole for gate formation between the source and the drain; forming a gate in the contact hole and at the same time forming source and drain electrodes on the ohmic metallic layers; depositing a first SiN layer over the gate, the source and drain electrodes and the surface passivation layer; selectively etching the first SiN layer so as to expose top surfaces only of the source and drain electrodes; plating a gold layer only on the source and drain electrodes; depositing a second SiN layer over the first SiN layer and the gold layer; and forming a gold coating layer on a rear surface of the substrate.

In the method, the step of forming the channel layer comprises forming a high-doped GaAs layer on the first undoped GaAs buffer layer and forming a low-doped GaAs layer on the high-doped GaAs layer.

In the method, the step of forming the superlattice layer comprises forming repeatedly several tens of $Al_xGa_{1-x}As$/GaAs films.

In the method, each of the $Al_xGa_{1-x}As$/GaAs films is approximately 50 Å in thickness.

In the method, a first distance between the gate and the source is set relatively longer than a second distance between the gate and the drain.

In the method, the first distance is approximately 0.5 μm and the second distance is approximately 0.8 to 1.5 μm range.

In the method, each of the source and drain is formed of AuGe/Ni ohmic electrode.

In accordance with of the method, parasitic carriers occurring in interface between the substrate and the first undoped GaAs buffer layer are prevented from being introduced into the channel layer by the superlattice layer during operation of the device.

According to another aspect of the present invention, the method for fabricating a GaAs power semiconductor device operating at a low voltage comprises the steps of forming an undoped GaAs buffer layer on a semi-insulating GaAs substrate; growing a superlattice layer on the undoped GaAs buffer layer; forming a channel layer on the undoped GaAs buffer layer; depositing a surface passivation layer on the channel layer; etching a plurality of layers formed on the substrate using a device isolating mask so as to electrically isolate elements; selectively etching the surface passivation layer to form contact holes for source/drain formation and forming ohmiate.c metallic layers in the contact holes; sequentially removing the surface passivation layer and the channel layer to some deep extent to form a contact hole for gate formation between the source and the drain; forming a gate in the contact hole and at the same time forming source and drain electrodes on the ohmic metallic layers; depositing a first SiN layer over the gate, the source and drain electrodes and the surface passivation layer; selectively etching the first SiN layer so as to expose top surfaces only of the source and drain electrodes; plating a gold layer only on the source and drain electrodes; depositing a second SiN layer over the first SiN layer and the gold layer; and forming a gold coating layer on a rear surface of the substr In the GaAs power semiconductor device which is fabricated in accordance with the method, when the device is operated, parasitic carriers occurring in interface between the substrate and the undoped GaAs buffer layer are prevented from being introduced into the channel layer by the superlattice layer. The undoped GaAs layer on the active channel layer is used as a surface passivation layer, whereby to prevent the active channel layer from surface defects created by oxygen chemisorption.

BRIEF DESCRIPTION OF THE DRAWINGS

This invention may be better understood and its objects will become apparent to those skilled in the art by reference to the accompanying drawings as follows.

DESCRIPTION OF THE PREFERRED EMBODIMENT(S)

Figure 3A:
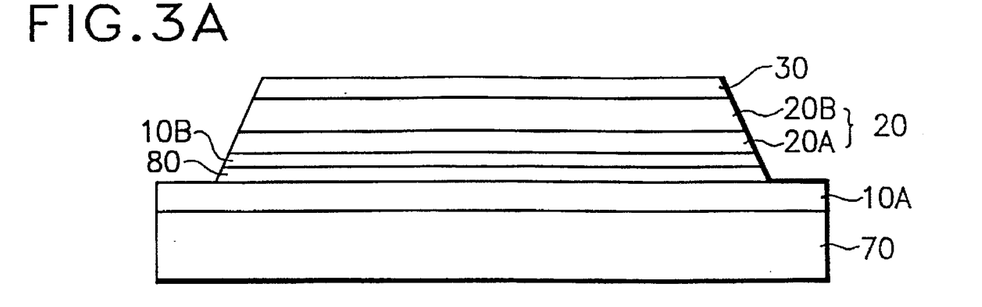
FIGS. 3A to 3F are cross-sectional views showing process steps of fabricating a GaAs power semiconductor device in accordance with one embodiment of the present invention.

Referring now to the figures of the drawings, and FIG. 3A in particular, the GaAs power semiconductor device in accordance with the present invention is provided with a first GaAs buffer layer 10A, a superlattice layer 80, a second GaAs buffer layer 10B, a channel layer 20 and an undoped GaAs layer 30 which are sequentially formed on a semi-insulating GaAs substrate 70. The superlattice layer 80 is formed of several tens of $Al_xGa_{1-x}As$/GaAs films, each of which has approximately 50 Å thickness. The channel layer 20 is formed of a so-called double-structure channel layer, or a high-low doped channel layer which includes a high doped GaAs layer 20A formed on the second buffer layer 10B and a low doped GaAs layer 20B formed on the high doped GaAs layer 20A. The undoped GaAs layer 30 formed on the low doped GaAs layer 20B is used for surface passivation of the channel layer 20.

As shown also in FIG. 3A, all of the layers which are formed on the substrate 70 are selectively etched and thus, a device-isolation is accomplished. The superlattice layer 80 formed between the first and second buffer layers 10A and 10B serves as a protective layer for preventing parasitic carries occurring between the substrate 70 and the first buffer layer 10A from being introduced into the channel layer 20. Also, the undoped GaAs layer 30 functions as a protective layer for preventing the channel layer 20 from surface defects created by oxygen chemisorption.

Figure 3B:
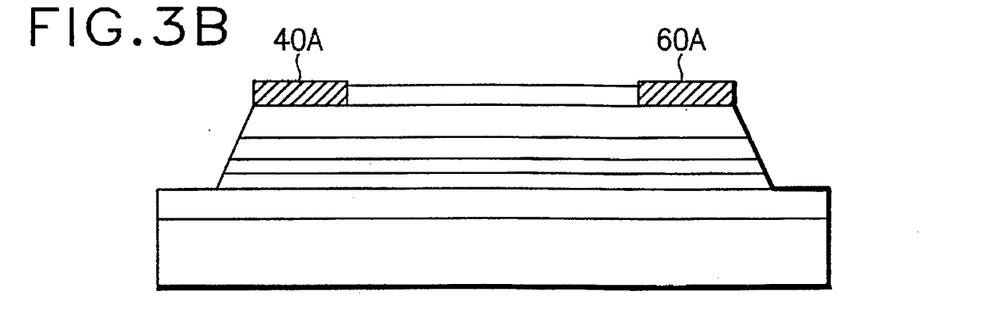

As shown in FIG. 3B, to form source and drain contact layers, source and drain regions are defined using an imaging resist as a mask, before the undoped GaAs layer 30 is patterned by conventional lithography and etching. As a result, contact holes corresponding the source and drain regions are formed to accomplish electrical connection with the surface of the low doped GaAs layer 20B. Next, a thin AuGe/Ni film is formed in the contact holes of the patterned GaAs layer 30 to form ohmic contact layers 40A and 60A for source/drain In the process step of forming the source/drain contact layer, the AuGe/Ni film is used to improve a morphology of source/drain.

Figure 3C:
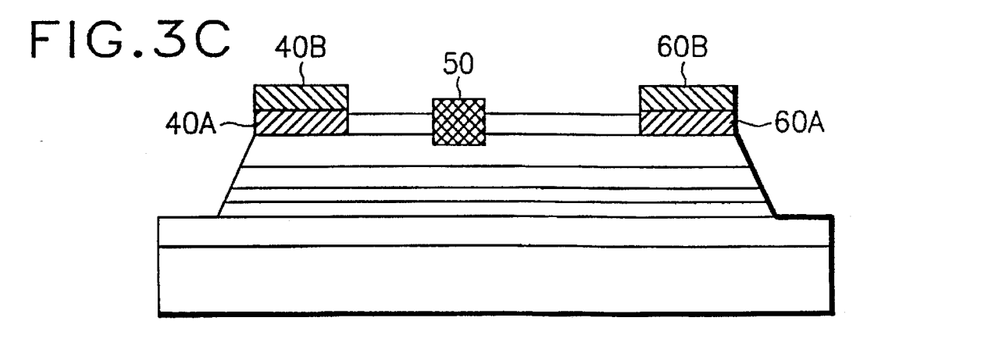

The next process step is formation of a gate electrode, as shown in FIG. 3C. This is accomplished by a wide-recess etching using a patterned resist as a gate forming mask and thereafter by deposition of a metallic layer. By the wide-recess etching, a gate contact hole is formed to some deep extent in the low doped GaAs layer. Also the metallic layer thereon is formed in the gate contact hole and on the ohmic contact layers 40A and 60A, so as to simultaneously form source/drain electrodes 40B and 60B and a gate electrode 50. Then, in the process step of forming the gate electrode, a total gate width and a respective length of the gate electrode are determined by the gate forming mask. A first distance between the gate and source electrodes and a second distance between the gate and drain electrodes are determined by the gate forming mask. In the embodiment, the total gate width and the length of each gate electrode are set in the range of 11 to 21 nm and in the range of 0.4 to 0.7 µm, respectively. The first distance is approximately 0.5 µm and the second distance is in the range of 0.8 to 1.5 µm. A pinch-off voltage serving as an important characteristic of a power semiconductor device can be controlled by the wide-recess etching. In detail, when a gate-source bias voltage is forwardly applied to the device, drain current thereof can be increased in accordance with the depth of the gate contact hole formed by the wide-recess etching. As a result, output characteristic of the device can be improved.

Figure 3D:
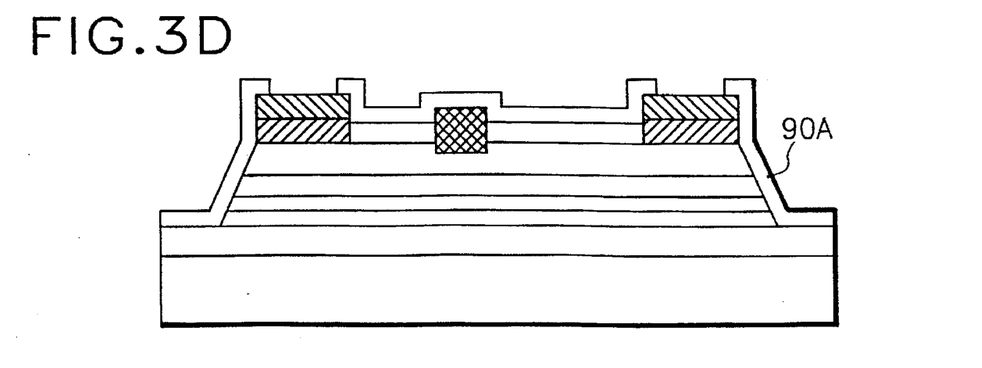

As shown in FIG. 3D, after deposition of a thin silicon nitride layer 90A over the above electrodes and the undoped GaAs layer 30, a selective etching is performed to remove the silicon nitride layer 90A only on the source and drain electrodes and thus form contact holes for Au plating.

Figure 3E:
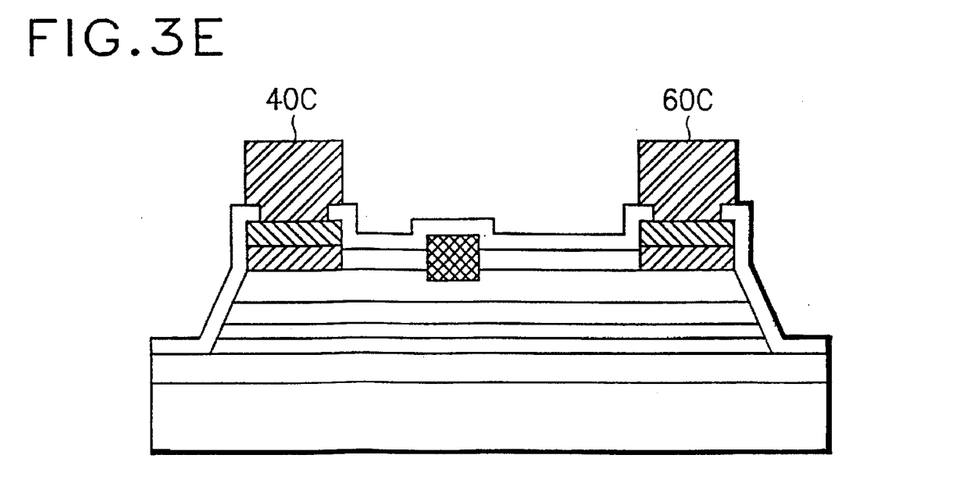

As shown in FIG. 3E, an Au plating layer 40C, 60C is coated in the contact holes formed by the selective etching of the silicon nitride (SiN) layer 90A. As not shown in FIG. 3E, an electrical connection of adjacent source electrodes is also accomplished by the Au plating and is of an airbridge type. The SiN layer 90A is used to prevent an electrical short between the Au plating layer and the gate electrode during fabrication of the device and between the Au plating layers or each Au plate layer and the gate electrode during lift-off process step.

Figure 3F:
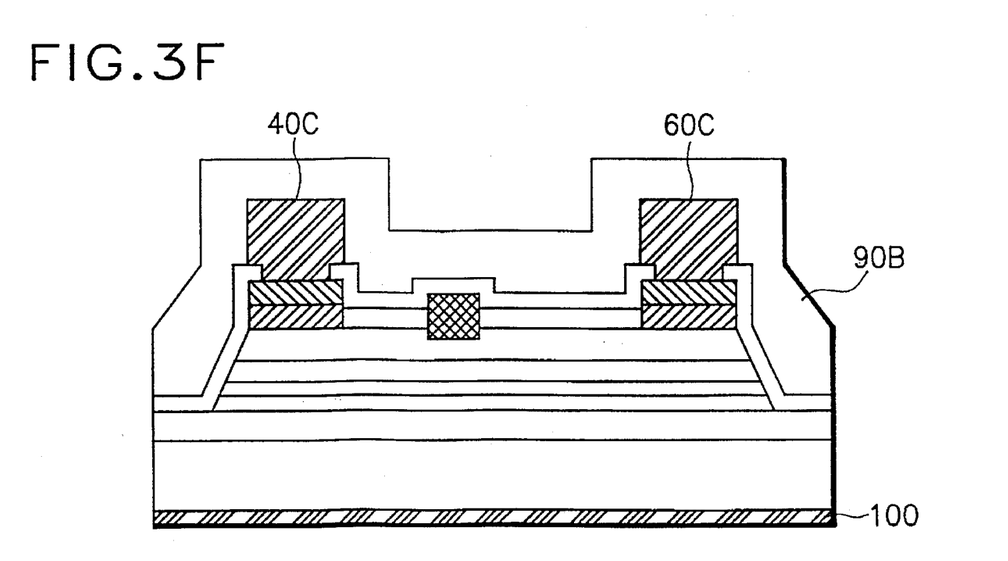

As shown in FIG. 3F, deposition of a thick silicon nitride layer 90B over the Au plating layer and the undoped GaAs layer 30 is performed to protect the device from damage caused by external defects. Next, an Au plating layer 100 is formed on a rear surface of the substrate.

Figure 4:
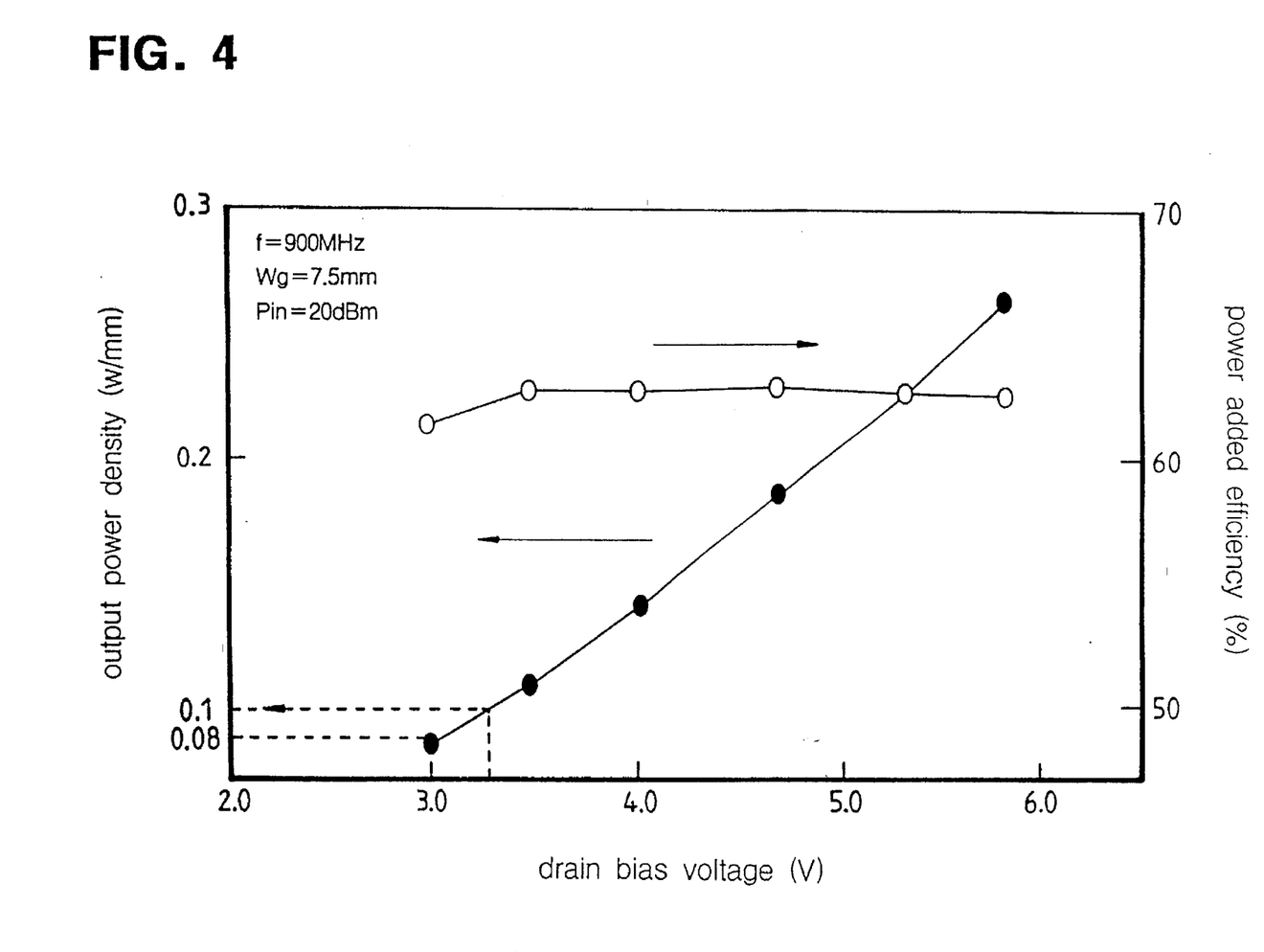
FIG. 4 is a graph showing output power density and drain bias voltage characteristics of a GaAs power semiconductor device which has a high output power density and a high power added efficiency with respect to a low source voltage and which is fabricated in accordance with the method of the present invention.

FIG 4. shows a relationship between an output power density and a power added efficiency with respect to a low source voltage in an example where the GaAs power semiconductor device fabricated in accordance with the process steps has a total gate width of 7.5 nm and is supplied with a source voltage of 3.0 to 6.0 V. In FIG. 4, a power added efficiency can be obtained at greater than 60% at a drain bias voltage of 3.0 to 5.8 V, and a output power density of 0.08 W/mm is measured at 3.0 V. It can be seen from FIG. 4 that, when a GaAs power semiconductor device has 1.2 W(30.8 dBm) at less than 3.0 V in the source voltage, it is desirable to design the GaAs power semiconductor device having a gate width of about 16 nm.

Figure 5:
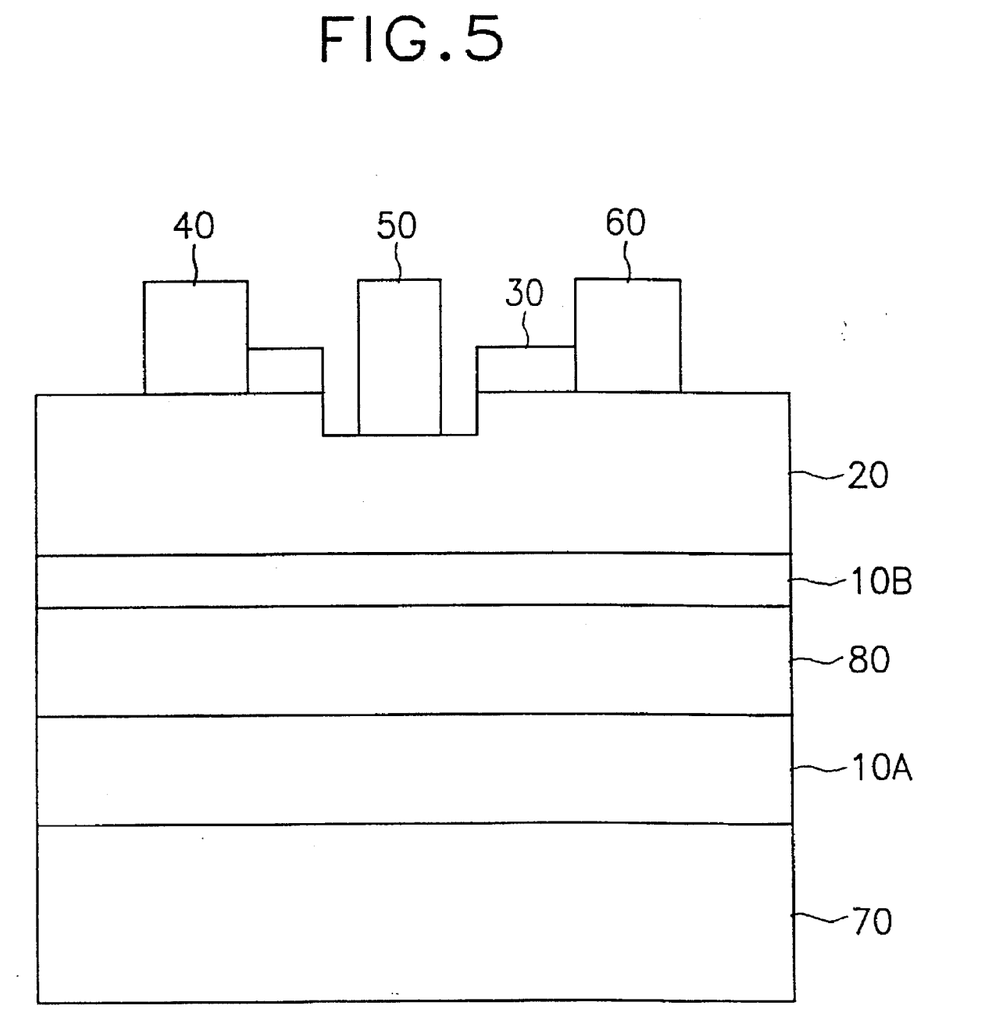
FIG. 5 is a schematic view showing the construction of the GaAs power semiconductor device which is fabricated in accordance with the method of the present invention, so as to described a structural difference between the device of the present invention and the conventional device.

FIG. 5 is a schematic view showing the construction of the GaAs power semiconductor device which is fabricated in accordance with the process steps of FIGS. 3A to 3F, so as to depict a structural difference between the semiconductor device and the conventional device as shown in FIG. 1. As shown in FIG. 5, the semiconductor device of the present invention is provided with the superlattice layer 80 between the first and second GaAs buffer layers 10A and 10B. Because the superlattice layer 80 is used to prevent the parasitic carriers occurring between the substrate and the first GaAs buffer layer from being introduced into the channel layer 20, the output conductance of the device can be reduced. As a result, the device has a high output power gain and a high efficiency.

In addition, because the channel layer 20 is formed of a high-low doped channel structure, the the output power gain at the operating point of the device can be greatly increased. This is because the low doped GaAs layer 20B of the channel layer serves as a thick depletion layer using a voltage applied to the gate electrode 50 just on the layer 20B. Therefore, a parasitic capacitance produced just below the gate electrode can be reduced. The high doped GaAs layer 20A of the channel layer allows a current gain (or a transconductance) to be uniform and a current gain to be large even if the channel layer is closed by applying a negative voltage between the gate and source electrodes. As a result, the GaAs power semiconductor device of the present invention has an improved output power gain and power added efficiency and thus can be particularly applicable to a further small hand-held phone.

Furthermore, because the undoped GaAs layer 30 serves as a surface passivation layer, the active channel layer can be prevented from surface defects created by oxygen chemisorption in air. Therefore, a gate-to-drain breakdown voltage can be improved by preventing occurrence of the surface defects of the channel layer.

Figure 6:
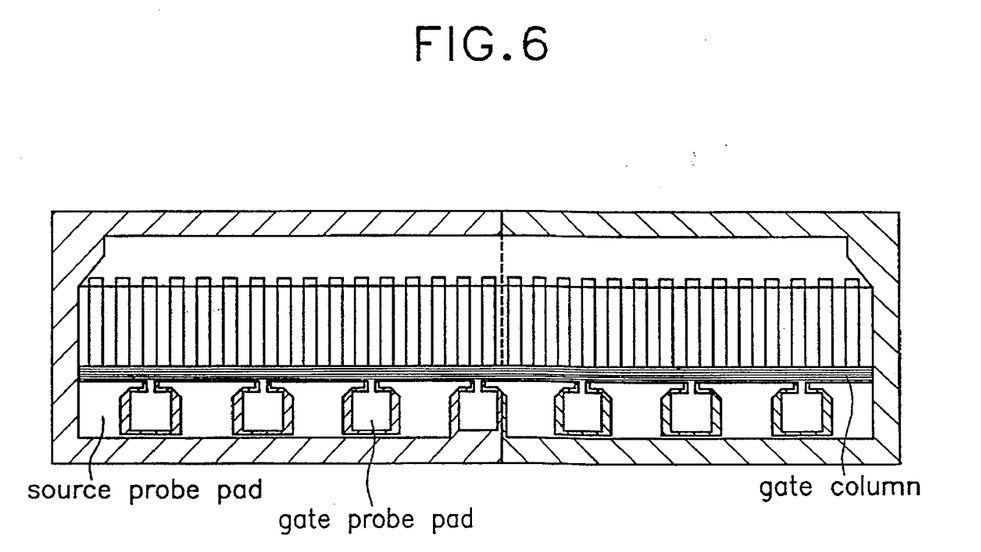
FIG. 6 is a plane view showing a chip in which the GaAs power semiconductor devices of the present invention are embodied.

FIG. 6 is a view of a chip in which the GaAs power semiconductor device of the present invention is embodied. As shown in FIG. 6, the semiconductor device is fabricated using a mask with 30 µm in a distance between adjacent gates and 0.6 µm in a gate length.

Figure 7:
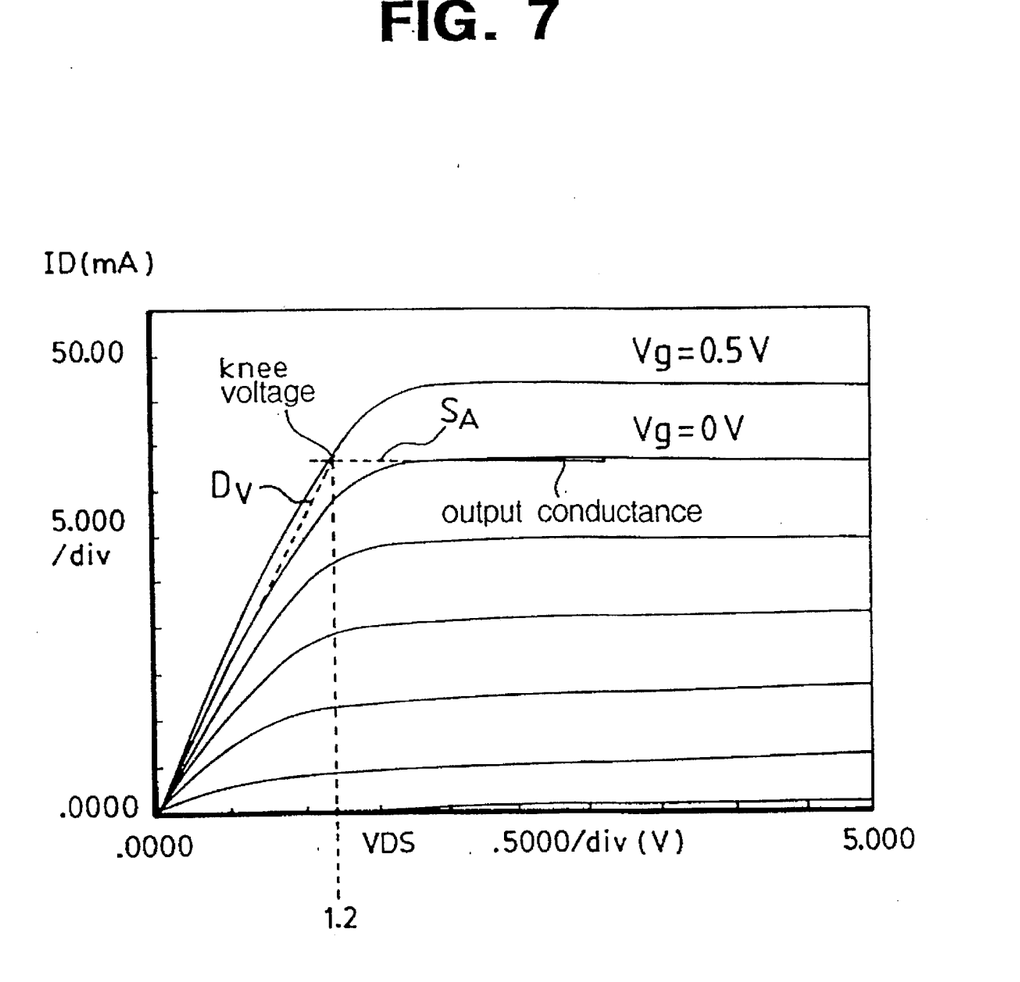
FIG. 7 is a graph showing current-voltage characteristics of the GaAs power semiconductor device of FIG. 5.

FIG. 7 shows current-voltage characteristics of the GaAs power semiconductor device with 0.8 µm gate length and 150 µm gate width which is fabricated in accordance with the present invention. As shown in FIG. 5, the knee voltage of the device is an intersection of dotted lines $S_A$ and $D_V$ representing a saturation current and a low drain voltage, respectively, and the output conductance thereof is a gradient of current-voltage in a saturation current region. The knee voltage is approximately 1.2 V and the gradient of the output conductance is nearly parallel to the saturation current $S_A$, as compared to those of the conventional device. As described above, the knee voltage of the conventional device is approximately 1.7 V and the gradient of the output conductance thereof is diagonally sloped. Therefore, it can be seen from FIGS. 2 and 7 that the device of the present invention has a relatively low output conductance as compared to that of the conventional device of FIG. 1. The measured gate breakdown voltage and the transconductance of the device of FIG. 5 are nearly equal to those of the conventional device of FIG. 1.

Figure 8:
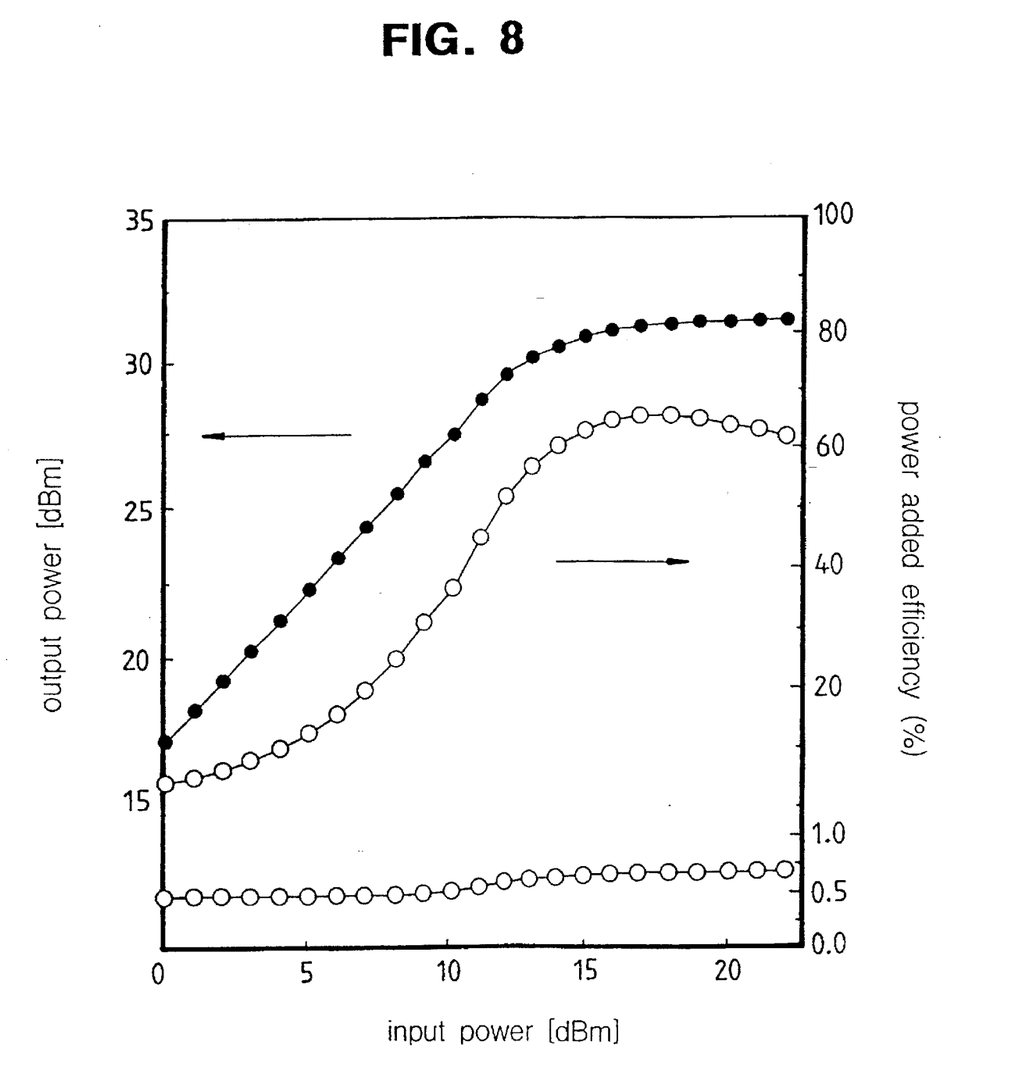
FIG. 8 is a graph showing a relationship between output power and output added efficiency with respect to input power of the GaAs power semiconductor device of FIG. 5.

FIG. 8 shows a relationship between output power and output added efficiency with respect to input power of the GaAs power semiconductor device with 0.6 µm gate length and 16 nm gate width. As shown in FIG. 8, the power semiconductor device has excellent frequency response characteristics which are 31.6 dBm in maximum output power and 65% in PAE. This is because the knee voltage and output conductance are relatively lower owing to structural features shown in the device of FIG. 5. The structural features are to form a superlattice layer between first and second GaAs buffer layers, to form a surface passivation layer just on an active channel layer, and to form a high-low doped channel structure. Also, the output power gain of the device is determined by a total gate width.

Figure 9:
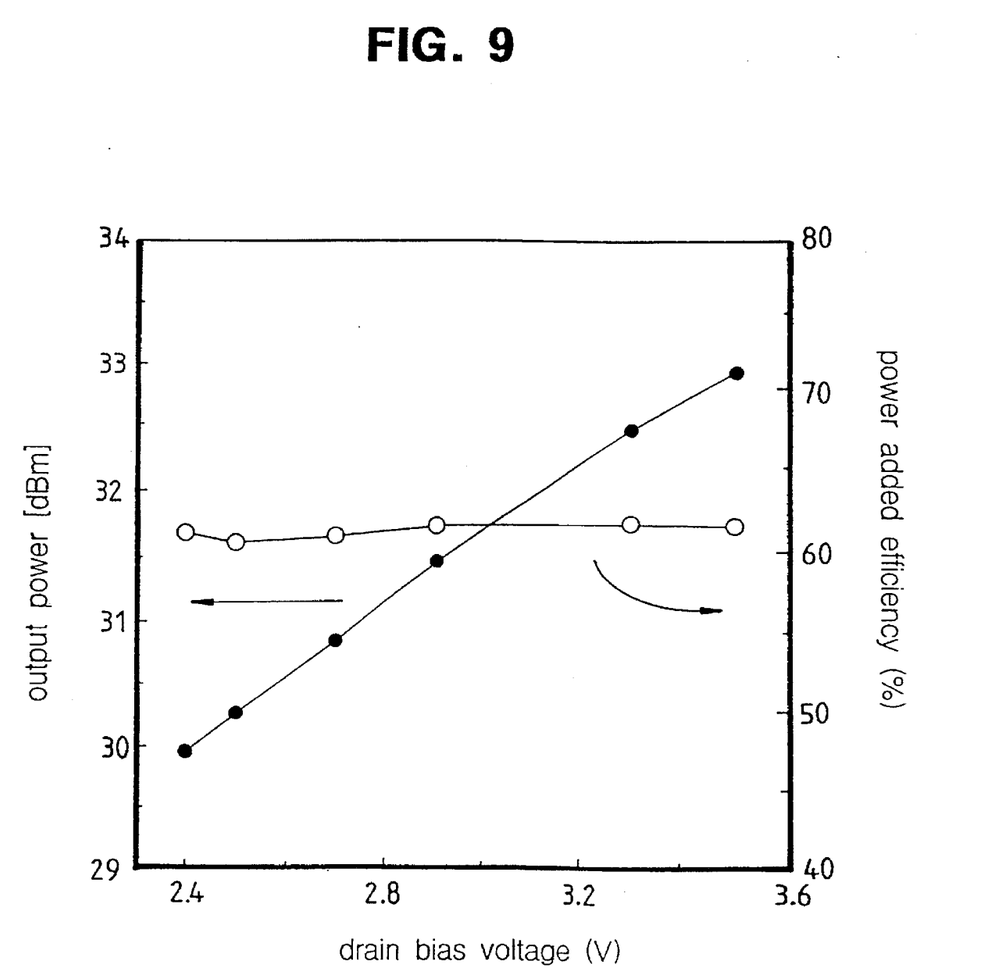
FIG. 9 is a view showing a relationship between output power and power added efficiency with respect to drain bias voltage applied to the GaAs power semiconductor device of FIG. 5.

FIG. 9 shows a relationship between output power and power added efficiency with respect to drain bias voltage applied to the GaAs power semiconductor device of FIG. 5. As can be seen from FIG. 9, the device has PAE of 65% or more when the drain bias voltage of 2.4 to 3.5 V is applied. Because the device has 30.8 dBm(1.2 W) output power and 63% PAE at 2.7 V of drain bias voltage, it can be embodied in a hand-held phone with a small battery of 3.0 V, for example lithium battery.

Hereinafter, the fabricating method of the GaAs semiconductor device according to another embodiment of the present invention will be described in detail with reference to FIGS. 10A to 10F. Component elements having similar functions to the component elements of the fabricating method of the first embodiment (shown in FIGS. 3A to 3F) are indicated by the same reference numerals, and descriptions thereof are omitted.

The GaAs power semiconductor of this embodiment is different from the GaAs power semiconductor device of the first embodiment in that a superlattice layer is formed between a GaAs buffer layer and an active channel layer. In this embodiment, when the device is operated, parasitic carriers occurring in interface between the substrate and the undoped GaAs buffer layer can be completely prevented from being introduced into the channel layer by the superlattice layer, as compared with the GaAs semiconductor device of the first embodiment.

Figure 10A:
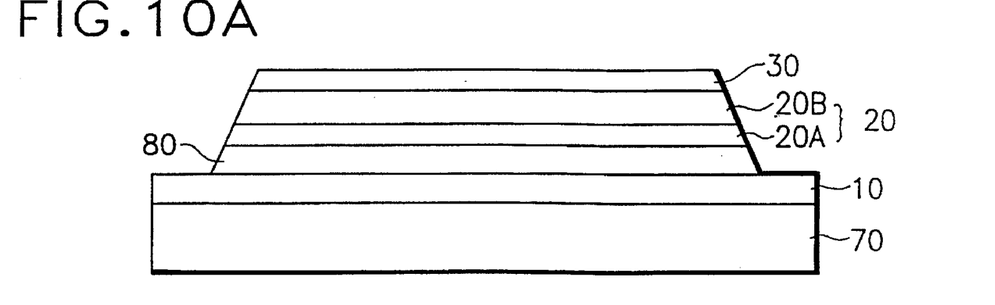
FIGS. 10A to 10F are cross-sectional views showing process steps of fabricating a GaAs power semiconductor device in accordance with another embodiment.

Referring now to the figures of the drawings, and FIG. 10A in particular, the GaAs power semiconductor device fabricated in accordance with the present invention is provided with an undoped GaAs buffer layer 10, a superlattice layer 80, a channel layer 20 and an undoped GaAs layer 30 which are sequentially formed on a semi-insulating GaAs substrate 70. The superlattice layer 80 is formed of several tens of $Al_xGa_{1-x}As$/GaAs films, each of which has approximately 50 Å thickness. The channel layer 20 is formed of a so-called double-structure channel layer, or a high-low doped channel structure which includes a high doped GaAs layer 20A formed on the undoped GaAs buffer layer 10 and a low doped GaAs layer 20B formed on the high doped GaAs layer 20A. The undoped GaAs layer 30 formed on the low doped GaAs layer 20B is used for surface passivation of the channel layer 20.

As shown also in FIG. 10A, all of the layers which are formed on the substrate 70 are selectively etched and thus, a device-isolation is accomplished. The superlattice layer 80 formed between the buffer layers 10 and the channel layer 20 serves as a protective layer for preventing parasitic carries occurring between the substrate 70 and the buffer layer 10 from being introduced into the channel layer 20. Also, the undoped GaAs layer 30 functions as a protective layer for preventing the channel layer 20 from surface defects created by oxygen chemisorption.

Figure 10B:
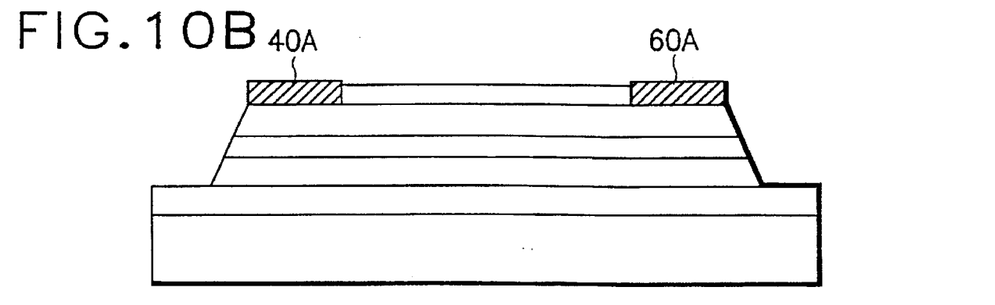

With reference to FIG. 10B, to form source and drain contact layers, source and drain regions are defined using an imaging resist as a mask, before the undoped GaAs layer 30 is patterned by conventional lithography and etching. As a result, contact holes corresponding the source and drain regions are formed to accomplish electrical connection with the surface of the low doped GaAs layer 20B. Next, a thin AuGe/Ni film is formed in the contact holes of the patterned GaAs layer 30 to form Ohmic contact layers 40A and 60A for source/drain. In the process step of forming the source/drain contact layer, the AuGe/Ni film is used to improve a morphology of source/drain.

Figure 10C:
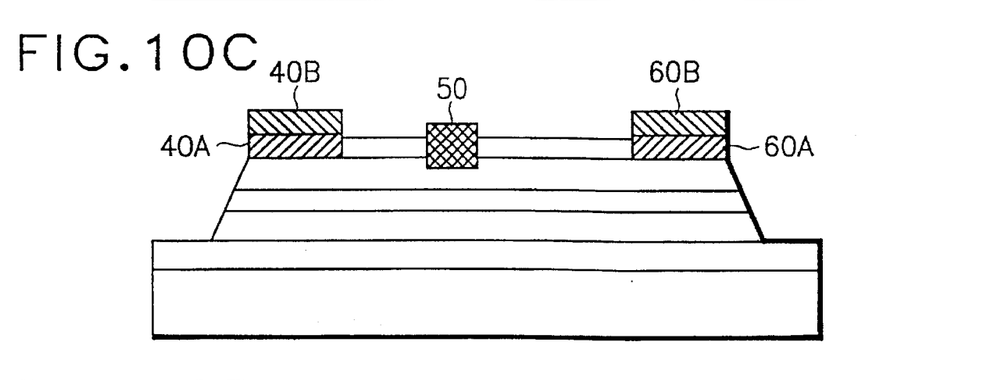

The next process step is formation of a gate electrode, as shown in FIG. 10C. This is accomplished by a wide-recess etching using a patterned resist as a gate forming mask and thereafter by deposition of a metallic layer. By the wide-recess etching, a gate contact hole is formed to some deep extent in the low doped GaAs layer. Also the metallic layer thereon is formed in the gate contact hole and on the ohmic contact layers 40A and 60A, whereby to simultaneously form source/drain electrodes 40B and 60B and a gate electrode 50. Then, in the process step of forming the gate electrode, a total gate width and a respective length of the gate electrode are determined by the gate forming mask. A first distance between the gate and source electrodes and a second distance between the gate and drain electrodes are determined by the gate forming mask. In the embodiment, the total gate width and the length of each gate electrode are set in the range of 11 to 21 nm and in the range of 0.4 to 0.7 μm, respectively. The first distance is approximately 0.5 μm and the second distance is in the range of 0.8 to 1.5 μm. A pinch-off voltage serving as an important characteristic of a power semiconductor device can be controlled by the wide-recess etching. In detail, when a gate-source bias voltage is forwardly applied to the device, drain current thereof can be increased in accordance with the depth of the gate contact hole formed by the wide-recess etching. As a result, output characteristic of the device can be improved.

Figure 10D:
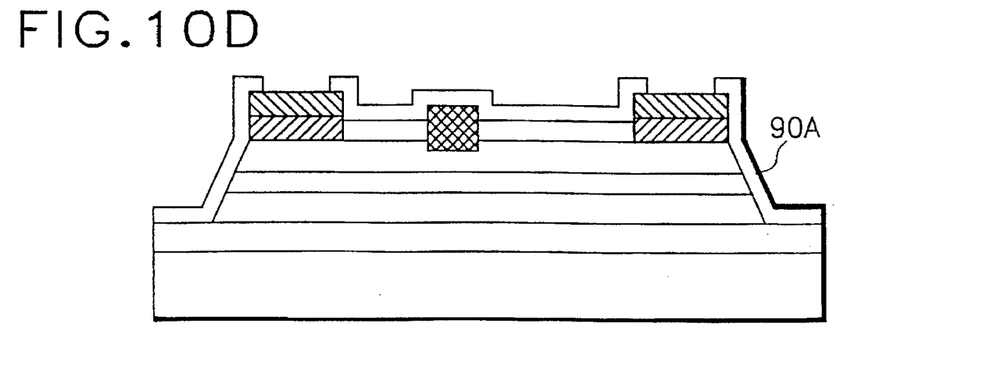

In FIG. 10D, after deposition of a thin silicon nitride layer 90A over the above electrodes and the undoped GaAs layer 30, a selective etching is performed to remove the silicon nitride layer 90A only on the source and drain electrodes and thus form contact holes for Au plating.

Figure 10E:
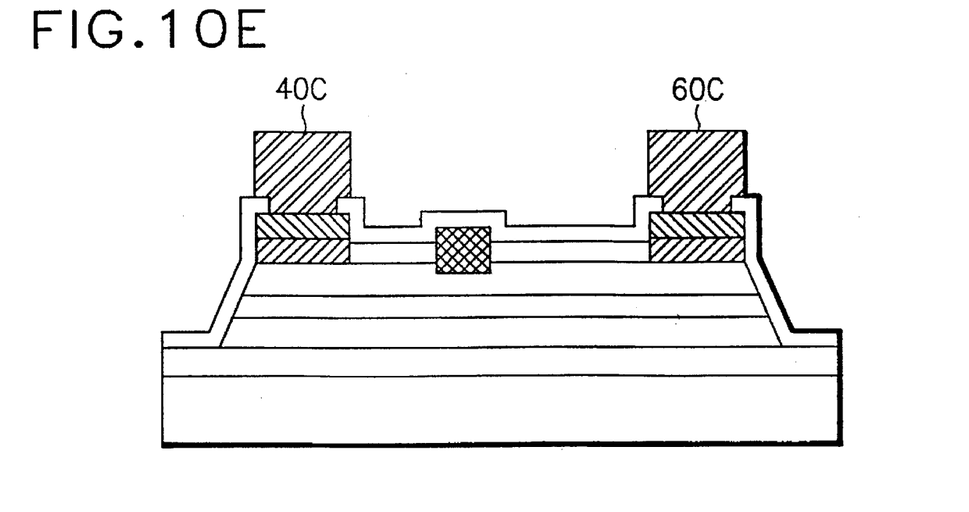

As indicated in FIG. 10E, an Au plating layer 40C, 60C is coated in the contact holes formed by the selective etching of the silicon nitride (SiN) layer 90A. As not shown in FIG. 10E, an electrical connection of adjacent source electrodes is also accomplished by the Au plating and is of an airbridge type. The SiN layer 90A is used to prevent an electrical shortage between the Au plating layer and the gate electrode during fabrication of the device and between the Au plating layers or each Au plate layer and the gate electrode during lift-off process step.

Figure 10F:
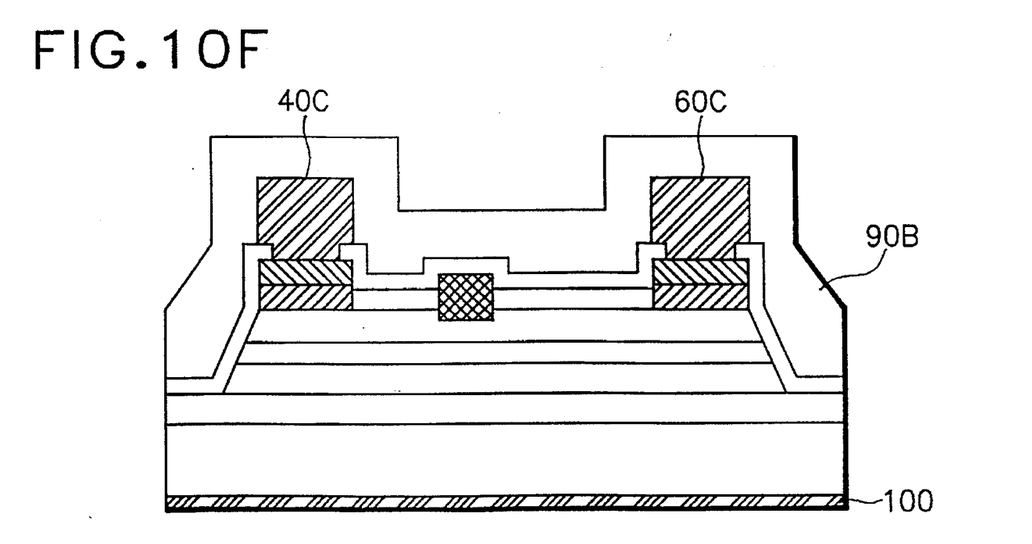

As shown in FIG. 10F, deposition of a thick silicon nitride layer 90B over the Au plating layer and the undoped GaAs layer 30 is performed to protect the device from damage occurring by external defects. Next, an Au plating layer 100 is formed on a rear surface of the substrate.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

What is claimed is:

1. A method for fabricating a GaAs power semiconductor device operating at a low voltage, the method comprising the steps of:

forming a first undoped GaAs buffer layer on a semi-insulating GaAs substrate;

growing a superlattice layer on the first undoped GaAs buffer layer;

forming a second undoped GaAs buffer layer on the superlattice layer;

forming a channel layer on the second undoped GaAs buffer layer, said channel layer being formed of a high-low doped GaAs layer;

depositing a surface passivation layer on the channel layer;

etching a plurality of layers formed on the substrate using a device isolating mask so as to electrically isolate elements;

selectively etching the surface passivation layer to form contact holes for source/drain formation and forming ohmic metallic layers in the contact holes;

sequentially removing the surface passivation layer and the channel layer to some deep extent to form a contact hole for gate formation between the source and the drain;

forming a gate in the contact hole and at the same time forming source and drain electrodes on the ohmic metallic layers;

depositing a first SiN layer over the gate, the source and drain electrodes and the surface passivation layer;

selectively etching the first SiN layer so as to expose top surfaces only of the source and drain electrodes;

plating a gold layer only on the source and drain electrodes;

depositing a second SiN layer over the first SiN layer and the gold layer; and forming a gold coating layer on a rear surface of the substrate, wherein parasitic carriers occurring in interface between the substrate and the first undoped GaAs buffer layer are prevented from being introduced into the channel layer by the superlattice layer during operation of the device.

2. The method as defined in claim 1, wherein the step of forming the high-low doped GaAs layer comprises forming a high-doped GaAs layer on the first undoped GaAs buffer layer and forming a low-doped GaAs layer on the high-doped GaAs layer.

3. The method as defined in claim 1, wherein the step of forming the superlattice layer comprises forming repeatedly several tens of $Al_xGa_{1-x}As/GaAs$ films.

4. The method as defined in claim 3, wherein each of the $Al_xGa_{1-x}As/GaAs$ films is approximately 50 Å in thickness.

5. The method as defined in claim 1, wherein a fist distance between the gate and the source is set relatively longer than a second distance between the gate and the drain.

6. The method as defined in claim 5, wherein the first distance is approximately 0.5 μm and the second distance is approximately 0.8 to 1.5 μm range.

7. The method as defined in claim 1, wherein each of the source and drain is formed of AuGe/Ni ohmic electrode.

8. A method for fabricating a GaAs power semiconductor device operating at a low voltage, the method comprising the steps of:

forming an undoped GaAs buffer layer on a semi-insulating GaAs substrate;

growing a superlattice layer on the undoped GaAs buffer layer;

forming a channel layer on the undoped GaAs buffer layer, said channel layer being formed of a high-low doped GaAs layer;

depositing a surface passivation layer on the channel layer;

etching a plurality of layers formed on the substrate using a device isolating mask so as to electrically isolate elements;

selectively etching the surface passivation layer to form contact holes for source/drain formation and forming ohmic metallic layers in the contact holes;

sequentially removing the surface passivation layer and the channel layer to some deep extent to form a contact hole for gate formation between the source and the drain;

forming a gate in the contact hole and at the same time forming source and drain electrodes on the ohmic metallic layers;

depositing a first SiN layer over the gate, the source and drain electrodes and the surface passivation layer;

selectively etching the first SiN layer so as to expose top surfaces only of the source and drain electrodes;

plating a gold later only on the source and drain electrodes;

depositing a second SiN layer over the first SiN layer and the gold layer; and forming a gold coating layer on a rear surface of the substrate, wherein parasitic carriers occurring in interface between the substrate and the undoped GaAs buffer layer are prevented from being introduced into the channel layer by the superlattice later during operation of the device.

9. The method as defined in claim 8, wherein the step of forming the high-low doped GaAs layer comprises forming a high-doped GaAs layer on the first undoped GaAs buffer layer and forming a low-doped GaAs layer on the high-doped GaAs layer.

10. The method as defined in claim 8, wherein the step of forming the superlattice layer comprises forming repeatedly several tens of $Al_xGa_{1-x}As/GaAs$ films.

11. The method as defined in claim 10, wherein each of the $Al_xGa_{1-x}As/GaAs$ films is approximately 50 Å in thickness.

12. The method as defined in claim 8, wherein a fist distance between the gate and the source is set relatively longer than a second distance between the gate and the drain.

13. The method as defined in claim 12, wherein the first distance is approximately 0.5 μm and the second distance is approximately 0.8 to 1.5 μm range.

14. The method as defined in claim 8, wherein each of the source and drain is formed of AuGe/Ni ohmic electrode.

* * * * *